US008357984B2

(12) United States Patent
Mao et al.

(10) Patent No.: US 8,357,984 B2
(45) Date of Patent: Jan. 22, 2013

(54) IMAGE SENSOR WITH LOW ELECTRICAL CROSS-TALK

(75) Inventors: Duli Mao, Sunnyvale, CA (US); Sohei Manabe, San Jose, CA (US); Vincent Venezia, Sunnyvale, CA (US); Hsin-Chih Tai, Cupertino, CA (US); Hidetoshi Nozaki, Sunnyvale, CA (US); Yin Qian, Milpitas, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 549 days.

(21) Appl. No.: 12/259,143

(22) Filed: Oct. 27, 2008

(65) Prior Publication Data

US 2009/0200590 A1    Aug. 13, 2009

Related U.S. Application Data

(60) Provisional application No. 61/027,396, filed on Feb. 8, 2008.

(51) Int. Cl.
*H01L 27/146* (2006.01)
(52) U.S. Cl. ............... 257/447; 257/E27.13; 438/70
(58) Field of Classification Search ............ 257/233, 257/292
See application file for complete search history.

(56) References Cited

U.S. PATENT DOCUMENTS

| | | | |
|---|---|---|---|
| 5,514,887 A | 5/1996 | Hokari | |
| 6,184,100 B1 * | 2/2001 | Arai | 438/328 |
| 6,521,920 B2 * | 2/2003 | Abe | 257/223 |
| 7,397,076 B2 * | 7/2008 | Jang | 257/292 |
| 7,642,614 B2 * | 1/2010 | Hirata | 257/446 |
| 7,741,666 B2 * | 6/2010 | Nozaki et al. | 257/292 |
| 2003/0025160 A1 | 2/2003 | Suzuki et al. | |
| 2003/0030083 A1 * | 2/2003 | Lee et al. | 257/292 |
| 2005/0035375 A1 * | 2/2005 | Hirata | 257/225 |
| 2005/0179053 A1 * | 8/2005 | Ezaki et al. | 257/189 |
| 2005/0221541 A1 * | 10/2005 | Metzler et al. | 438/142 |
| 2006/0006488 A1 | 1/2006 | Kanbe | |
| 2007/0045665 A1 | 3/2007 | Park | |
| 2007/0063234 A1 * | 3/2007 | Itonaga | 257/291 |
| 2007/0069315 A1 | 3/2007 | Stevens et al. | |
| 2007/0145443 A1 | 6/2007 | Lim | |

OTHER PUBLICATIONS

First Office Action and Search Report with English translation for ROC Taiwan Patent Application 098103970, issued on Oct. 25, 2012, 14 pages.

* cited by examiner

*Primary Examiner* — Benjamin Sandvik
(74) *Attorney, Agent, or Firm* — Blakely Sokoloff Taylor & Zafman LLP

(57) ABSTRACT

An array of pixels is formed using a substrate, where each pixel has a substrate having a backside and a frontside that includes metalization layers, a photodiode formed in the substrate, frontside P-wells formed using frontside processing that are adjacent to the photosensitive region, and an N-type region formed in the substrate below the photodiode. The N-type region is formed in a region of the substrate below the photodiode and is formed at least in part in a region of the substrate that is deeper than the depth of the frontside P-wells.

18 Claims, 6 Drawing Sheets

IMAGE SENSOR WITH LOW ELECTRICAL CROSS-TALK

CROSS-REFERENCE TO RELATED APPLICATION

This application claims the priority of the Provisional U.S. Patent Application 61/027,396 filed Feb. 8, 2008.

This disclosure relates generally to imaging circuits, and more particularly, but not exclusively, relates to image sensors.

BACKGROUND INFORMATION

Integrated circuits have been developed to reduce the size of components used to implement circuitry. For example, integrated circuits have been using ever-smaller design features, which reduces the area used to implement the circuitry, such that many design features are now well under the wavelengths of visible light. With the ever-decreasing sizes of image sensors and the individual pixels that are part of a sensing array, it is important to more efficiently capture incident light that illuminates the sensing array. Thus, more efficiently capturing incident light helps to maintain or improve the quality of electronic images captured by the sensing arrays of ever-decreasing sizes.

BRIEF DESCRIPTION OF THE DRAWINGS

Non-limiting and non-exhaustive embodiments of the disclosure are described with reference to the following figures, wherein like reference numerals refer to like parts throughout the various views unless otherwise specified.

DETAILED DESCRIPTION

Figure 1:
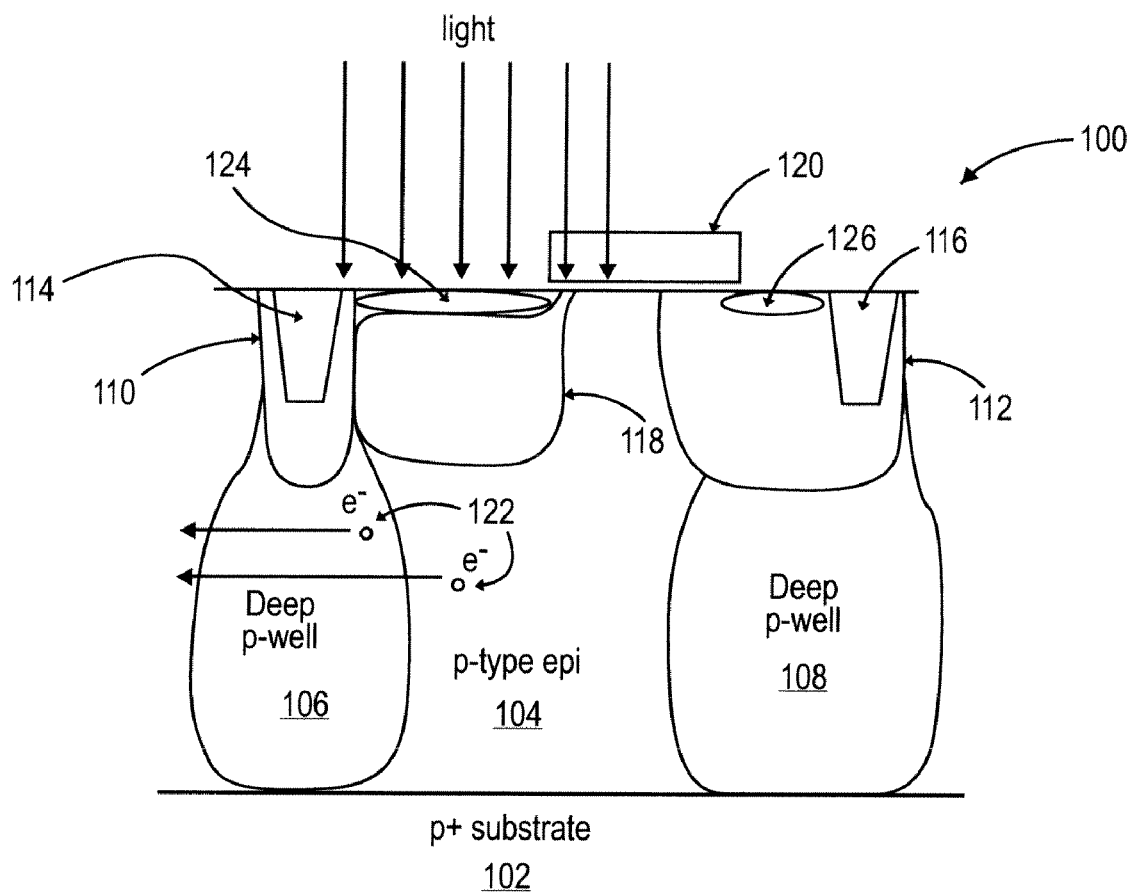
FIG. 1 is a cross-section of a frontside illuminated conventional image sensor pixel.

Embodiments of an image sensor are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. The term "or" as used herein is normally meant to encompass a meaning of an inclusive function, such as "and/or."

In general, integrated circuits comprise circuitry that is employed for a variety of applications. The applications use a wide variety of devices such as logic devices, imagers (including CMOS and CCD imagers), and memory (such as DRAM and NOR- and NAND-based flash memory devices). These devices normally employ transistors for a variety of functions, including switching and amplification of signals.

Transistors are typically formed in integrated circuits by photolithographic processes that are performed on a silicon substrate. The processes include steps such as applying a photolithographic resist layer to the substrate, exposing the resist layer to a pattern using light (including deep ultra-violet wavelengths), removing the exposed portions (or non-exposed portions depending on the photo-positive or photo-negative resists that are used) of the resist by etching, and modifying the exposed structure, for example, by etching and depositing and/or implanting additional materials to form various structure for electronic components (including transistors).

The term "substrate" includes substrates formed using semiconductors based upon silicon, silicon-germanium, germanium, gallium arsenide, and the like. The term substrate may also refer to previous process steps that have been performed upon the substrate to form regions and/or junctions in the substrate. The term substrate can also include various technologies, such as doped and undoped semiconductors, epitaxial layers of silicon, and other semiconductor structures formed upon the substrate.

Chemical-mechanical planarization (CMP) can be performed to render the surface of the modified substrate suitable for forming additional structures. The additional structures can be added to the substrate by performing additional processing steps, such as those listed above.

As the size of the image sensors in individual pixels that are part of a sensing array become increasingly smaller, various designs attempt to more efficiently capture the incident light that illuminates the sensing array. For example, the area of the light sensing element (such as a photodiode) of a pixel is typically maximized by arranging a microlens over (or underneath) each pixel so that the incident light is better focused onto the light sensing element. The focusing of the light by the microlens attempts to capture light that would otherwise normally be incident upon the pixel outside the area occupied by the light sensitive element (and thus lost and/or "leaked" through to other unintended pixels).

Another approach that can be used is to collect light from the "backside" of (e.g., underneath) the CMOS image sensor. Using the backside of the image sensor allows photons to be collected in an area that is relatively unobstructed by the many dielectric and metal layers that are normally included in a typical image sensor. A backside illuminated (BSI) image sensor can be made by thinning the silicon substrate of the image sensor, which reduces the amount of silicon through which incident light traverses before the sensing region of the image sensor is encountered.

However, when thinning the substrate of the image sensor, a tradeoff between the sensitivity of the pixel and crosstalk (with adjacent pixels) is encountered. For example, when less thinning is used (which results in a thicker remaining silicon substrate), a larger (volumetric) region of a photodiode for conversion of light to electron-hole pairs can be provided. When the electron-hole pairs are formed relatively far away (in the larger provided region) from the photodiode depletion region, the formed electron-hole pairs are more likely to be captured by adjacent photodiodes. The capturing of the formed electron-hole pairs by adjacent photodiodes is normally an undesired effect called electrical cross-talk (which causes adjacent pixels to appear to be brighter than the "true" value and can degrade color fidelity of the output). Accordingly, the probability of electrical cross-talk increases with the thickness of the silicon substrate, while sensitivity decreases as the thinner silicon substrates are used.

FIG. 1 is a cross-section of a frontside illuminated conventional image sensor pixel. The image sensor 100 includes the P+ substrate 102. Substrate 102 has a P-type epitaxial region 104 formed above the substrate 102. Epitaxial region 104 has deep P-wells 106 and 108 formed in the epitaxial region 104. P-wells 110 and 112 are formed above the deep P-wells 106 and 108, respectively. Shallow-trench isolation region 114 is formed within P-well 110 and shallow-trench isolation region 116 is formed within P-well 112. N-type floating drain 126 is formed in P-well 112. N-type photodiode region 118 is implanted in epitaxial region 104 in a region that is between P-well 110 and P-well 112. A P-type pinning layer 124 is implanted in a region that is above N-type photodiode region 118. Transfer gate 120 is formed above epitaxial region 104 to control transfer of electrons from N-type photodiode region 118 to a floating drain 126.

In operation, photons traversing the photodiode region 118 are often absorbed in the silicon of photodiode region 118 and P-type epitaxial region 104 such that electron-hole pairs are generated. The electron-hole pairs that are generated in a depletion region of the PN junction are separated such that electrons are collected in the N-type photodiode region 118, where the electrons are later transferred to the floating drain 126 when the transfer gate 120 is activated.

However, the electron-hole pairs that are generally formed outside of the depletion region are not separated as effectively as they would have been within the depletion region, and thus have a higher chance to recombine (which lessens the sensitivity of pixels). The electrons of the electron-hole pairs also have a higher chance to diffuse to neighboring pixels, which leads to reduced sensitivity and higher cross-talk. As conventional image sensors become smaller and smaller due to increasing scales of integration, the problems of reduced sensitivity and higher cross-talk are increased.

Figure 2:
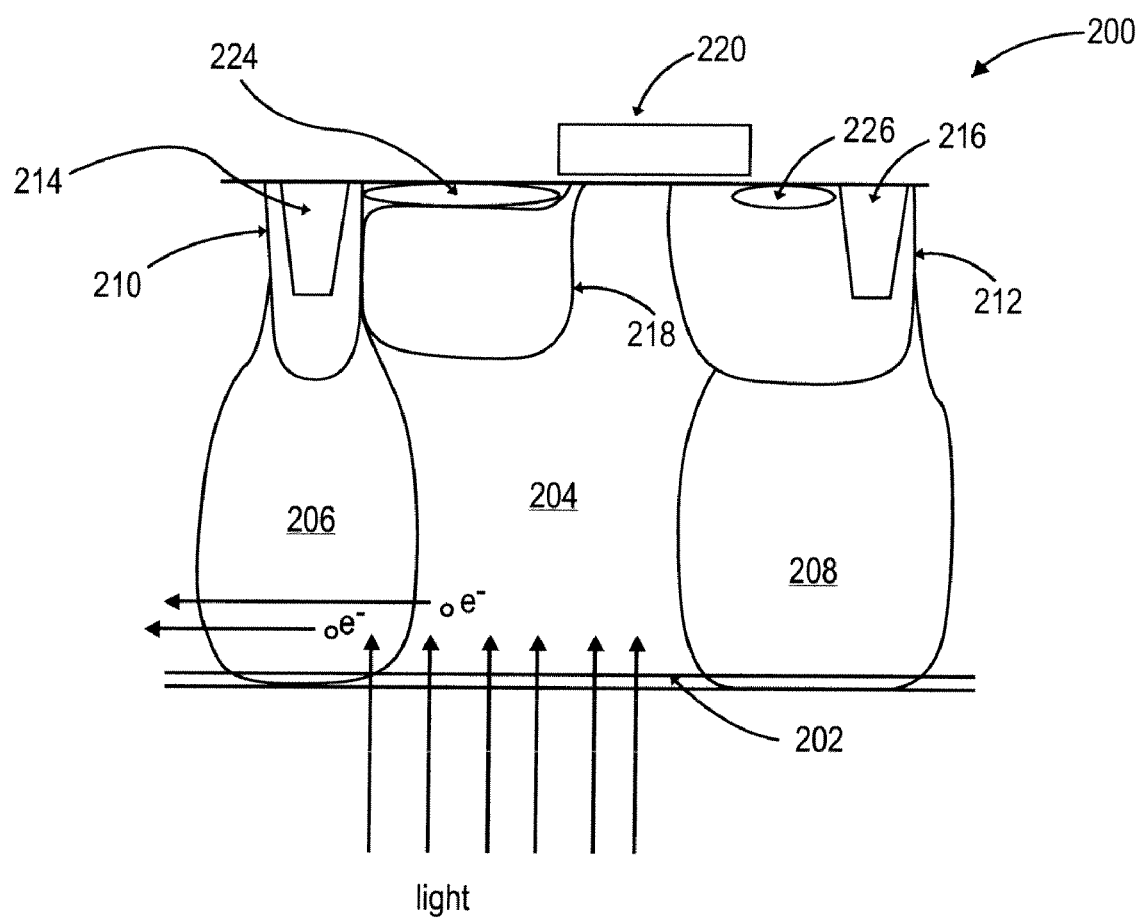
FIG. 2 is a cross-section of a backside illuminated conventional image sensor pixel.

FIG. 2 is a cross-section of a backside illuminated conventional image sensor pixel. The image sensor 200 includes a P-type epitaxial region 204. Epitaxial region 204 has deep P-wells 206 and 208 formed in the epitaxial region 204. P-wells 210 and 212 are formed above the deep P-wells 206 and 208, respectively. Shallow-trench isolation region 214 is formed within P-well 210 and shallow-trench isolation region 216 is formed within P-well 212. N-type floating drain 226 is formed in P-well 212. N-type photodiode region 218 is implanted in epitaxial region 204 in a region that is between P-well 210 and P-well 212. A P-type pinning layer 224 is implanted in a region that is above N-type photodiode region 218. Transfer gate 220 is formed above epitaxial region 204 to control transfer of electrons from N-type photodiode region 218 to a detector (not shown).

In operation, photons traversing the photodiode region 218 from the backside are often absorbed in the silicon of photodiode region 218 and P-type epitaxial region 204 such that electron-hole pairs are generated. The electrons of the electron-hole pairs are ideally collected in the N-type photodiode region 218, where the electrons are later transferred to a floating drain 226 when the transfer gate 220 is activated. However, the electron-hole pairs are often generated in region 204, which is relatively distant from the photodiode region 218 (thus providing a greater chance for recombination or cross-talk).

For backside illuminated (BSI) image sensors, the problems of reduced sensitivity and higher cross-talk are further increased because the majority of the photon absorption typically occurs near the backside (near the passivation layer 202, formed on the backside of the region 204) and away from the signal collection area of the photodiode (which is closer to the frontside of the silicon surface). The P-wells 206 and 208 are generally not effective at preventing cross-talk because the electrons generated within the deep P-well can diffuse either to the intended pixel or the neighboring pixel. Even electrons generated in the neutral region of the epitaxial region 204 beneath the photodiode region 218 can diffuse to neighboring pixels because the barrier formed between P-type epitaxial silicon and the deep P-well is generally insufficient to impede many of the electrons.

The relatively wide width of the P-wells 206 and 208 is also problematic for BSI devices because of the reduced area available for the photon sensor. P-wells 206 and 208 (implanted from the frontside) are typically widest near the backside of the silicon due to formation by high energy implantation, which results in lateral extensions of implanted ions (e.g., "straggle"). Consequently, methods to reduce cross-talk and increase pixel sensitivity are desired for sensors having small pixel sizes and for BSI image sensors.

In accordance with the present disclosure, improved structures are disclosed to increase the sensitivity of image sensor pixels. An array of pixels is formed using a substrate, where each pixel has a substrate having a backside, a frontside that includes metalization layers, a photodiode formed in the substrate, frontside P-wells formed using frontside processing that are adjacent to the photosensitive region, and an N-type region. The N-type region is formed in a region of the substrate below the photodiode and is formed at least in part in a region of the substrate that is deeper than the depth of the bottom extent to the top extent of the frontside P-wells.

Figure 3:
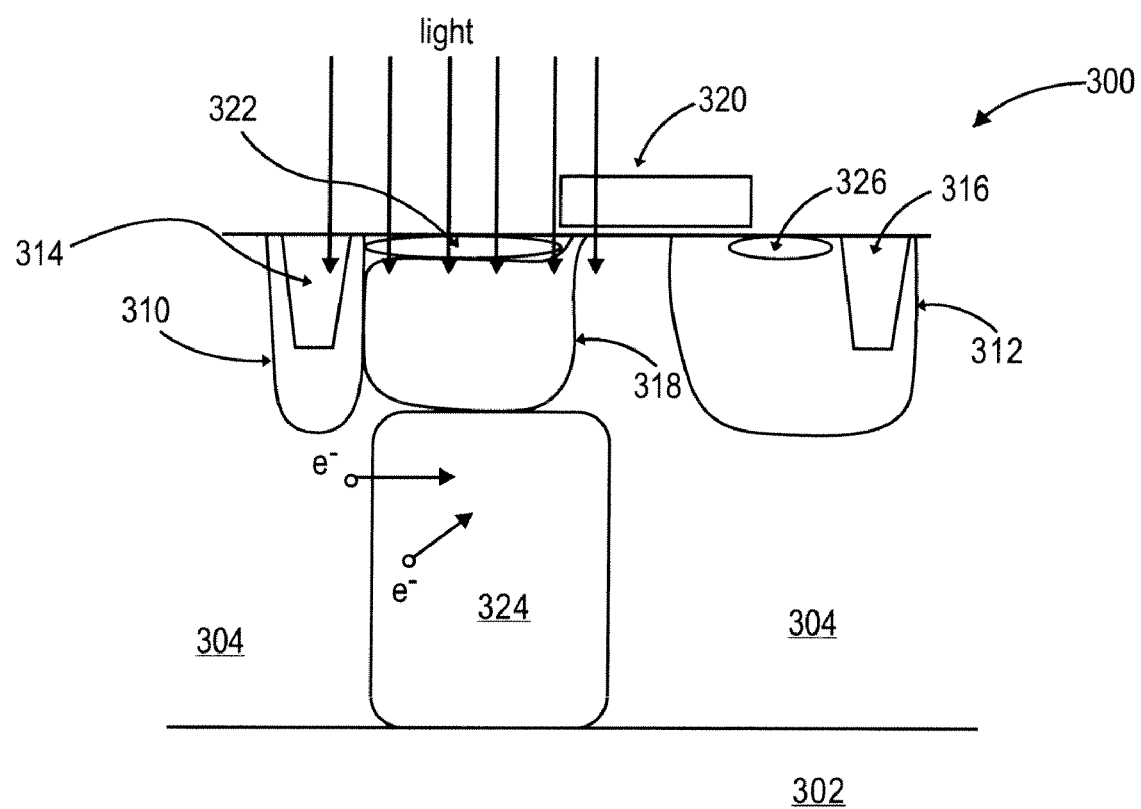
FIG. 3 is a cross-section of a frontside illuminated image sensor pixel in accordance with teachings of the present disclosure.

FIG. 3 is a cross-section of a frontside illuminated image sensor pixel in accordance with teachings of the present disclosure. The image sensor 300 includes a P+ substrate 302. Substrate 302 has a P-type epitaxial region 304 formed above the substrate 302. P-wells 310 and 312 are formed in the P-type epitaxial region 304. P-wells 310 and 312 are formed having an associated depth with respect to the frontside. Shallow-trench isolation region 314 is formed within P-well 310 and shallow-trench isolation region 316 is formed within P-well 312. N-type floating drain 326 is formed in P-well 312. N-type implant and/or diffusion region 324 is formed in epitaxial region 304 in a region that is adjacent to (and/or subjacent to) P-well 310 and P-well 312. The N-type implant and/or diffusion region 324 typically extends to N-type photodiode region 318, which is implanted (and/or diffused) in epitaxial region 304 in a region that is above N-type implant and/or diffusion region 324. The N-region can be at least 1 to 2 microns deep from the front-side silicon surface, and is typically not relative to a depth or a P-well. The N-type implant and/or diffusion region 324 can have a dopant concentration that is less than the dopant concentration level of N-type photodiode region 318. A P-type pinning layer 322 is implanted in a region that is above N-type photodiode region 318. A transfer gate 320 is formed above epitaxial region 304 to control transfer of electrons from N-type photodiode region 318 to a floating drain 326 for detecting the photo-generated electrons.

The N-type implant and/or diffusion region 324 (and the N-type photodiode region) and the P-well 310 and P-well 312

(which lie between pixels such that the pixels are separated) form a lateral PN junction. The lateral PN junction causes the photo-generated electrons to be retained by the intended pixel (e.g., the pixel in which the electrons were generated). As a result, the sensitivity of the pixel is enhanced and electrical cross-talk among pixels is greatly reduced, which increases the signal-to-noise ratio. Thus the N-type implant and/or diffusion region 324 increases the photosensitive region beyond the N-type photodiode region 318 itself.

Figure 4:
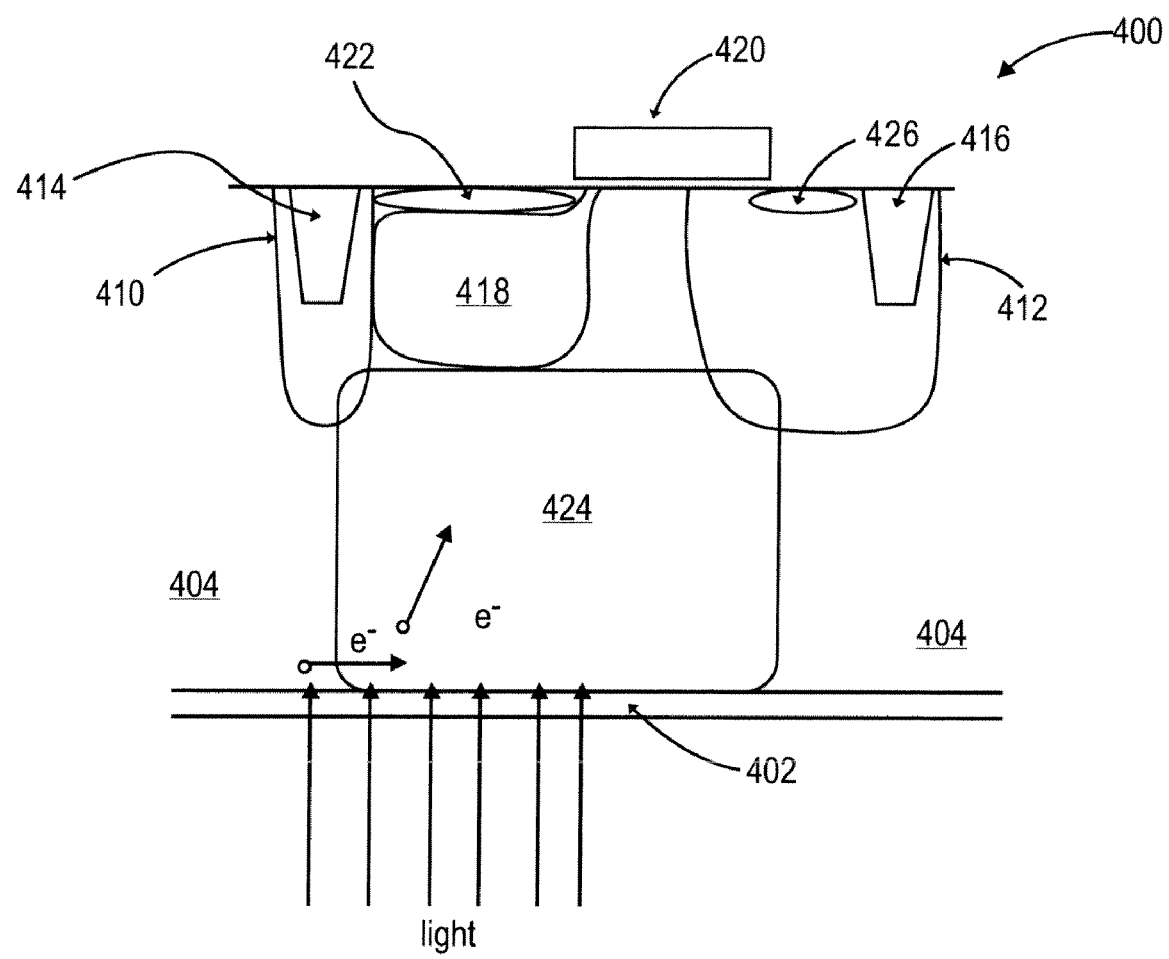
FIG. 4 is a cross-section of a backside illuminated image sensor pixel in accordance with teachings of the present disclosure.

FIG. 4 is a cross-section of a backside illuminated image sensor pixel in accordance with teachings of the present disclosure. The image sensor 400 includes a P-type epitaxial region 404. P-wells 410 and 412 are formed in the P-type epitaxial region 404. Shallow-trench isolation region 414 is formed within P-well 410 and shallow-trench isolation region 416 is formed within P-well 412. N-type implant and/or diffusion region 424 is formed in epitaxial region 404 in a region that is adjacent to (and/or subjacent to) P-well 410 and P-well 412. The N-region can be at least 1 to 2 microns deep from the front-side silicon surface, and is typically not relative to a depth or a P-well. N-type floating drain 426 is formed in P-well 412. The N-type implant and/or diffusion region 424 typically extends downwards vertically to the P+ passivation layer 402, which is formed on the lower surface of the epitaxial region 404. N-type implant and/or diffusion region 424 can be formed using frontside or backside processing. N-type photodiode region 418 is implanted in epitaxial region 404 in a region that is above N-type implant and/or diffusion region 424. A P-type pinning layer 422 is implanted in a region that is above N-type photodiode region 418. Transfer gate 420 is formed above epitaxial region 404 to control transfer of electrons from N-type photodiode region 418 to a floating drain 426 for detection of photo-generated electrons.

In another embodiment, an electronic barrier between pixels can be also optimized by doping the epitaxial-silicon. The epitaxial silicon can be doped without requiring P-type (deep) implantation (which requires larger regions, due to straggle). By doping the epitaxial-silicon using backside processing, the isolation region can be minimized. The smaller sized isolation region allows for a larger photo-sensitive region (which, for example, extends laterally from p-well 410 to p-well 412, and extends vertically from beneath p-type pinning implant 422 to P+ backside passivation layer 402).

In another embodiment, the P-type isolation region can be formed by implanting from both front and backsides. In BSI image sensors, for example, deep P-type isolation regions between pixels can be formed by performing a P-type isolation implantation from the backside. By implanting from the backside, complete P-type isolation is formed with each implant going only half the depth of the final silicon.

Figure 5:
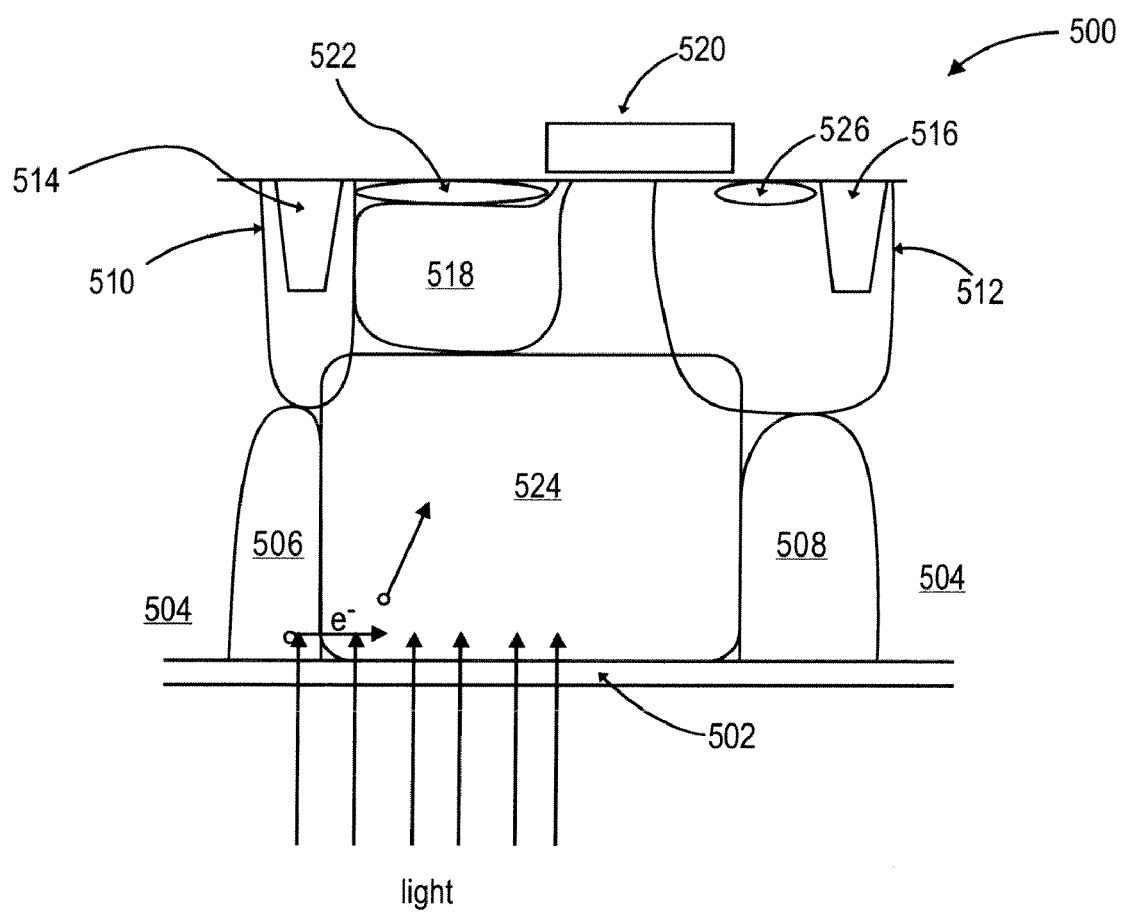
FIG. 5 is a cross-section of another backside illuminated image sensor pixel in accordance with teachings of the present disclosure

FIG. 5 is a cross-section of another backside illuminated image sensor pixel in accordance with teachings of the present disclosure. The image sensor 500 includes a P-type epitaxial region 504. P-wells 510 and 512 are formed in the P-type epitaxial region 504. Shallow-trench isolation region 514 is formed within P-well 510 and shallow-trench isolation region 516 is formed within P-well 512. N-type floating drain 526 is formed in P-well 512. P-wells 506 and 508 are "deep" P-type isolation regions between pixels and can be formed by performing a P-type isolation implantation from the backside. Implanting the backside P-wells reduces "straggle" and improves alignment with other backside structures as discussed below.

N-type implant and/or diffusion region 524 is formed in epitaxial region 504 in a region that is adjacent to (and/or subjacent to) P-well 510 and P-well 512. The N-region can be at least 1 to 2 microns deep from the front-side silicon surface, and is typically not relative to a depth or a P-well. The N-type implant and/or diffusion region 524 typically extends vertically from the N-type photodiode region 518 on downwards to the passivation layer 502, which is formed on the lower surface of the epitaxial region 504. N-type photodiode region 518 can be formed by implanting N-type dopants in epitaxial region 504 in a region that above N-type implant and/or diffusion region 524. A P-type pinning layer 522 is implanted in a region that is above N-type photodiode region 518. Transfer gate 520 is formed above epitaxial region 504 to control transfer of electrons from N-type photodiode region 518 to a floating drain 526 for detection of photo-generated electrons.

Because the majority of photon absorption occurs near the back surface for BSI devices, the P-type implantation depth required for p-wells 506 and 508 is typically much less than what is required for implantation from the frontside. The related photomask photoresist thickness can also be reduced compared to implantation from the frontside (saving processing costs) because of the lower energies required for implantation.

An additional advantage of performing the backside isolation implantation from the backside is that better alignment is achieved between the P-wells, color filters, and micro-lenses. Better alignment is achieved because the backside P-wells are aligned with reference to the same backside alignment marks that are used for patterning of other backside features. Frontside P-well implants typically have poorer alignment to color filters and microlenses because they are formed using frontside alignment marks, which are not always perfectly aligned with the backside alignment marks.

Figure 6:
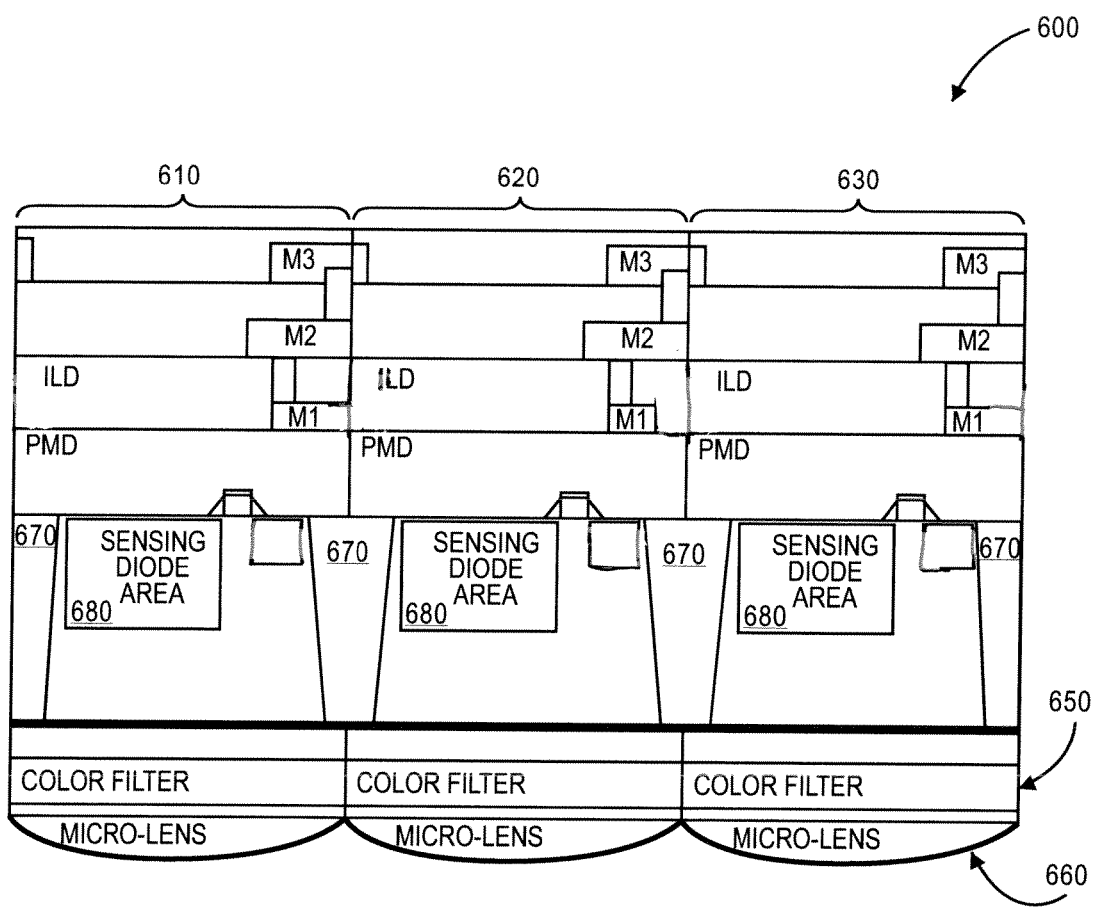
FIG. 6 shows a cross-section of a sample sensor array of backside illuminated (BSI) pixel of the CMOS image sensor.

To illustrate the arrangement of the image sensor pixel in a sensor array, FIG. 6 shows a cross-section of a sample sensor array of backside illuminated (BSI) pixel of the CMOS image sensor. Array 600 includes pixels 610, 620, and 630. Structure 600 typically contains at least thousands of pixels and often contains more than a million pixels. An isolation region 670 separates pixels. Three pixels are shown for the purpose of clarity.

The pixels of array 600 are typically arranged in a two-dimensional array such that an electronic image can be formed in response to incident light (640) being captured by each pixel. Each pixel can have a filter 650 (including color filters and infra-red filters) such that the electronic image can be used to capture color images or increase the sensitivity of the pixel to certain wavelengths of light, for example. Each pixel can also have a micro-lens 660 associated with each pixel such that the incident light is more directly guided into the pixel.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor, comprising:
   an array of complementary metal-oxide-semiconductor ("CMOS") pixels disposed in or on an epitaxial layer having a backside and a frontside, wherein metalization layers are disposed on the frontside, wherein a plurality of the pixels each includes:
a photodiode region disposed in the epitaxial layer;
frontside wells of a first polarity disposed in the epitaxial layer adjacent to either side of the photodiode region, the frontside wells of the first polarity forming charge carrier barrier regions between adjacent CMOS pixels of the array, and the frontside wells of the first polarity having an associated depth with respect to the frontside;
a region of a second polarity disposed in the epitaxial layer below the photodiode region, the region of the second polarity being disposed at least in part in a region of the epitaxial layer that is deeper than the depth of the frontside wells of the first polarity; and
first and second backside wells of the first polarity disposed within the epitaxial layer and extending up from the backside of the epitaxial layer,
wherein the region of the second polarity extends horizontally from the first backside well to the second backside well and contacts both the first and second backside wells,
wherein the region of the second polarity comprises a region having a single dopant concentration extending vertically from the photodiode region to the backside of the epitaxial layer.

2. The apparatus of claim 1, wherein the epitaxial layer is disposed on a substrate layer.

3. The apparatus of claim 2, wherein the region of the second polarity extends vertically to a boundary between the epitaxial silicon and the substrate layer.

4. The apparatus of claim 1, wherein the region of the second polarity is implanted using frontside processing.

5. The apparatus of claim 1, wherein the region of the second polarity is diffused using frontside processing.

6. The apparatus of claim 1, wherein the region of the second polarity is implanted using backside processing.

7. The apparatus of claim 1, wherein the region of the second polarity is diffused using backside processing.

8. The apparatus of claim 1, wherein the region of the second polarity extends horizontally from a first one of the frontside wells to a second one of the frontside wells, wherein the first and second ones of the frontside wells are adjacent to the photodiode on opposing sides of the photodiode.

9. The apparatus of claim 1, wherein the region of the second polarity extends vertically to a passivation layer disposed on the backside.

10. The apparatus of claim 1, wherein an N-type dopant concentration of the region of the second polarity is less than an N-type dopant concentration of the photodiode region.

11. The apparatus of claim 1, wherein the backside wells of the first polarity are disposed in a region of the epitaxial layer that is at least partly beneath a corresponding one of the frontside wells of the first polarity on either side of the photodiode.

12. The apparatus of claim 1, wherein the region of the second polarity extends vertically from a portion of the photodiode region to a passivation layer disposed on the backside.

13. A method, comprising:
forming a photosensitive region within a substrate having a backside and a frontside;
using frontside processing to form frontside P-wells that are adjacent to either side of the photosensitive region, the P-wells having an associated depth with respect to the frontside;
forming an N-type region in the substrate below the photosensitive region and laterally spaced between the frontside P-wells using backside processing, wherein the N-type region extends from the photosensitive region to the backside of the substrate with a single dopant concentration;
forming a transfer gate for capturing electrons generated photo-electrically in the N-type region or the photosensitive region; and
using backside processing to form first and second backside p-wells disposed within the substrate and extending up from the backside of the substrate,
wherein the N-type region extends horizontally from the first backside p-well to the second backside p-well and contacts both the first and second backside p-wells.

14. The method of claim 13, wherein the backside P-wells are formed underneath corresponding frontside P-wells.

15. A method, comprising:
forming a photosensitive region within a substrate having a backside and a frontside;
using frontside processing to form frontside P-wells that are adjacent to the photosensitive region, the P-wells forming electron barrier regions between pixels, and the P-wells having an associated depth with respect to the frontside;
forming an N-type region in the substrate below the photodiode, the N-type region being formed at least in part in a region of the substrate that is deeper than the depth of the frontside P-wells, wherein the N-type region comprises a region having a single dopant concentration that extends vertically from the photosensitive region to the backside; and
using backside processing to form first and second backside P-wells below the frontside P-wells within the substrate and extending up from the backside of the substrate,
wherein the N-type region extends horizontally from the first backside p-well to the second backside p-well and contacts both the first and second backside p-wells.

16. The method of claim 15, wherein the N-type region is implanted using backside processing.

17. An image sensor, comprising:
a pixel formed using a substrate, comprising:
a substrate having a backside and a frontside that includes metalization layers;
a photodiode formed in the substrate;
frontside P-wells formed using frontside processing that are adjacent to the photosensitive region, the P-wells forming electron barrier regions between the pixel and adjacent pixels, and the P-wells having an associated depth with respect to the frontside;
an N-type region formed in the substrate below the photodiode, the N-type region being formed at least in part in a region of the substrate that is deeper than the depth of the frontside P-well, wherein the N-type region extends from the photodiode down to the backside with a single dopant concentration; and
first and second backside p-wells disposed within the substrate and extending up from the backside of the substrate,
wherein the N-type region extends horizontally from the first backside p-well to the second backside p-well and contacts both the first and second backside p-wells.

18. The method of claim 13, wherein the N-type region extends laterally under the photosensitive region to interface with both frontside P-wells on either side of the photosensitive region.

* * * * *